(12) United States Patent
Im

(10) Patent No.: US 7,902,052 B2
(45) Date of Patent: *Mar. 8, 2011

(54) SYSTEM AND PROCESS FOR PROCESSING A PLURALITY OF SEMICONDUCTOR THIN FILMS WHICH ARE CRYSTALLIZED USING SEQUENTIAL LATERAL SOLIDIFICATION TECHNIQUES

(75) Inventor: James S. Im, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 376 days.

This patent is subject to a terminal disclaimer.

(21) Appl. No.: 12/013,825

(22) Filed: Jan. 14, 2008

(65) Prior Publication Data

US 2008/0124526 A1    May 29, 2008

Related U.S. Application Data

(63) Continuation of application No. 10/544,498, filed as application No. PCT/US2004/004929 on Feb. 18, 2004, now Pat. No. 7,341,928.

(60) Provisional application No. 60/448,713, filed on Feb. 19, 2003.

(51) Int. Cl.
*H01L 21/20* (2006.01)
*H01L 21/36* (2006.01)

(52) U.S. Cl. ........ 438/487; 117/44; 117/904; 219/121.6; 257/E21.134; 438/795

(58) Field of Classification Search ............ 117/44, 117/904; 257/E21.134; 438/487, 795; 219/121.6
See application file for complete search history.

(56) References Cited

U.S. PATENT DOCUMENTS

| | | | |
|---|---|---|---|
| 3,632,205 | A | 1/1972 | Marcy |
| 4,234,358 | A | 11/1980 | Celler et al. |
| 4,309,225 | A | 1/1982 | Fan et al. |
| 4,382,658 | A | 5/1983 | Shields et al. |
| 4,456,371 | A | 6/1984 | Lin |

(Continued)

FOREIGN PATENT DOCUMENTS

DE      19839718       3/2000

(Continued)

OTHER PUBLICATIONS

U.S. Appl. No. 60/253,256, filed Aug. 31, 2003, Im.

(Continued)

*Primary Examiner* — Asok K Sarkar
(74) *Attorney, Agent, or Firm* — Baker Botts LLP

(57) ABSTRACT

A process and system are provided for processing at least one section of each of a plurality of semiconductor film samples. In these process and system, the irradiation beam source is controlled to emit successive irradiation beam pulses at a predetermined repetition rate. Using such emitted beam pulses, at least one section of one of the semiconductor film samples is irradiated using a first sequential lateral solidification ("SLS") technique and/or a first uniform small grained material ("UGS") techniques to process the such section(s) of the first sample. Upon the completion of the processing of this section of the first sample, the beam pulses are redirected to impinge at least one section of a second sample of the semiconductor film samples. Then, using the redirected beam pulses, such section(s) of the second sample are irradiated using a second SLS technique and/or a second UGS technique to process the at least one section of the second sample. The first and second techniques can be different from one another or substantially the same.

8 Claims, 5 Drawing Sheets

U.S. PATENT DOCUMENTS

| | | | |
|---|---|---|---|
| 4,514,895 A | 5/1985 | Nishimura |
| 4,639,277 A | 1/1987 | Hawkins |
| 4,691,983 A | 9/1987 | Kobayashi et al. |
| 4,727,047 A | 2/1988 | Bozler et al. |
| 4,758,533 A | 7/1988 | Magee et al. |
| 4,793,694 A | 12/1988 | Liu |
| 4,800,179 A | 1/1989 | Mukai |
| 4,855,014 A | 8/1989 | Kakimoto et al. |
| 4,870,031 A | 9/1989 | Sugahara et al. |
| 4,940,505 A | 7/1990 | Schachameyer et al. |
| 4,970,546 A | 11/1990 | Suzuki et al. |
| 4,976,809 A | 12/1990 | Broadbent |
| 4,977,104 A | 12/1990 | Sawada et al. |
| 5,032,233 A | 7/1991 | Yu et al. |
| 5,061,655 A | 10/1991 | Ipposhi et al. |
| RE33,836 E | 3/1992 | Resor, III et al. |
| 5,145,808 A | 9/1992 | Sameshima et al. |
| 5,173,441 A | 12/1992 | Yu et al. |
| 5,204,659 A | 4/1993 | Sarma |
| 5,233,207 A | 8/1993 | Anzai |
| 5,285,236 A | 2/1994 | Jain |
| 5,291,240 A | 3/1994 | Jain |
| 5,304,357 A | 4/1994 | Sato et al. |
| 5,373,803 A | 12/1994 | Noguchi et al. |
| 5,395,481 A | 3/1995 | McCarthy |
| 5,409,867 A | 4/1995 | Asano |
| 5,413,958 A | 5/1995 | Imahashi et al. |
| 5,417,897 A | 5/1995 | Asakawa et al. |
| 5,436,095 A | 7/1995 | Mizuno et al. |
| 5,453,594 A | 9/1995 | Konecny |
| 5,456,763 A | 10/1995 | Kaschmitter et al. |
| 5,466,908 A | 11/1995 | Hosoya et al. |
| 5,496,768 A | 3/1996 | Kudo |
| 5,512,494 A | 4/1996 | Tanabe |
| 5,523,193 A | 6/1996 | Nelson |
| 5,529,951 A | 6/1996 | Noguchi et al. |
| 5,591,668 A | 1/1997 | Maegawa et al. |
| 5,614,421 A | 3/1997 | Yang |
| 5,614,426 A | 3/1997 | Funada et al. |
| 5,616,506 A | 4/1997 | Takemura |
| 5,620,910 A | 4/1997 | Teramoto |
| 5,710,050 A | 1/1998 | Makita et al. |
| 5,721,606 A | 2/1998 | Jain |
| 5,736,709 A | 4/1998 | Neiheisel |
| 5,742,426 A | 4/1998 | York |
| 5,756,364 A | 5/1998 | Tanaka et al. |
| 5,766,989 A | 6/1998 | Maegawa et al. |
| 5,767,003 A | 6/1998 | Noguchi |
| 5,817,548 A | 10/1998 | Noguchi et al. |
| 5,844,588 A | 12/1998 | Anderson |
| 5,858,807 A | 1/1999 | Kawamura |
| 5,861,991 A | 1/1999 | Fork |
| 5,893,990 A | 4/1999 | Tanaka |
| 5,948,291 A | 9/1999 | Neylan et al. |
| 5,960,323 A | 9/1999 | Wakita |
| 5,986,807 A | 11/1999 | Fork |
| 6,014,944 A | 1/2000 | Aklufi et al. |
| 6,020,224 A | 2/2000 | Shimogaichi et al. |
| 6,045,980 A | 4/2000 | Edelkind et al. |
| 6,072,631 A | 6/2000 | Guenther et al. |
| 6,081,381 A | 6/2000 | Shalapenok et al. |
| 6,093,934 A | 7/2000 | Yamazaki et al. |
| 6,117,301 A | 9/2000 | Freudenberger et al. |
| 6,117,752 A | 9/2000 | Suzuki |
| 6,120,976 A | 9/2000 | Treadwell et al. |
| 6,130,009 A | 10/2000 | Smith et al. |
| 6,130,455 A | 10/2000 | Yoshinouchi |
| 6,136,632 A | 10/2000 | Higashi |
| 6,156,997 A | 12/2000 | Yamazaki et al. |
| 6,162,711 A | 12/2000 | Ma et al. |
| 6,169,014 B1 | 1/2001 | McCulloch |
| 6,172,820 B1 | 1/2001 | Kuwahara |
| 6,176,922 B1 | 1/2001 | Aklufi et al. |
| 6,177,301 B1 | 1/2001 | Jung |
| 6,184,490 B1 | 2/2001 | Schweizer |
| 6,187,088 B1 | 2/2001 | Okumura |
| 6,190,985 B1 | 2/2001 | Buynoski |
| 6,193,796 B1 | 2/2001 | Yang |
| 6,198,141 B1 | 3/2001 | Yamazaki et al. |
| 6,203,952 B1 | 3/2001 | O'Brien et al. |
| 6,222,195 B1 | 4/2001 | Yamada et al. |
| 6,235,614 B1 | 5/2001 | Yang |
| 6,242,291 B1 | 6/2001 | Kusumoto et al. |
| 6,255,146 B1 | 7/2001 | Shimizu et al. |
| 6,274,488 B1 | 8/2001 | Talwar et al. |
| 6,285,001 B1 | 9/2001 | Fleming et al. |
| 6,300,175 B1 | 10/2001 | Moon |
| 6,313,435 B1 | 11/2001 | Shoemaker et al. |
| 6,316,338 B1 | 11/2001 | Jung |
| 6,320,227 B1 | 11/2001 | Lee et al. |
| 6,322,625 B2 | 11/2001 | Im |
| 6,326,286 B1 | 12/2001 | Park et al. |
| 6,333,232 B1 | 12/2001 | Kunikiyo |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,388,146 B1 | 5/2002 | Onishi et al. |
| 6,388,386 B1 | 5/2002 | Kunii et al. |
| 6,392,810 B1 | 5/2002 | Tanaka |
| 6,393,042 B1 | 5/2002 | Tanaka |
| 6,407,012 B1 | 6/2002 | Miyasaka et al. |
| 6,410,373 B1 | 6/2002 | Chang et al. |
| 6,429,100 B2 | 8/2002 | Yoneda |
| 6,432,758 B1 | 8/2002 | Cheng et al. |
| 6,437,284 B1 | 8/2002 | Okamoto et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka |
| 6,472,684 B1 | 10/2002 | Yamazaki et al. |
| 6,476,447 B1 | 11/2002 | Yamazaki et al. |
| 6,482,722 B2 | 11/2002 | Kunii et al. |
| 6,493,042 B1 | 12/2002 | Bozdagi et al. |
| 6,495,067 B1 | 12/2002 | Ono |
| 6,495,405 B2 | 12/2002 | Voutsas et al. |
| 6,501,095 B2 | 12/2002 | Yamaguchi et al. |
| 6,504,175 B1 | 1/2003 | Mei et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka |
| 6,516,009 B1 | 2/2003 | Tanaka |
| 6,521,473 B1 | 2/2003 | Jung |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,531,681 B1 | 3/2003 | Markle et al. |
| 6,535,535 B1 | 3/2003 | Yamazaki et al. |
| 6,555,449 B1 | 4/2003 | Im et al. |
| 6,562,701 B2 | 5/2003 | Ishida et al. |
| 6,563,077 B2 | 5/2003 | Im |
| 6,573,163 B2 | 6/2003 | Voutsas et al. |
| 6,573,531 B1 | 6/2003 | Im et al. |
| 6,577,380 B1 | 6/2003 | Farmiga et al. |
| 6,582,827 B1 | 6/2003 | Im |
| 6,590,228 B1 | 7/2003 | Voutsas et al. |
| 6,608,326 B1 | 8/2003 | Shinagawa et al. |
| 6,621,044 B2 | 9/2003 | Jain et al. |
| 6,635,554 B1 | 10/2003 | Im et al. |
| 6,635,932 B2 | 10/2003 | Grigoropoulos et al. |
| 6,660,575 B1 | 12/2003 | Zhang |
| 6,667,198 B2 | 12/2003 | Shimoto et al. |
| 6,693,258 B2 | 2/2004 | Sugano et al. |
| 6,734,635 B2 | 5/2004 | Kunii et al. |
| 6,750,424 B2 | 6/2004 | Tanaka |
| 6,755,909 B2 | 6/2004 | Jung |
| 6,767,804 B2 | 7/2004 | Crowder |
| 6,770,545 B2 | 8/2004 | Yang |
| 6,784,455 B2 | 8/2004 | Maekawa et al. |
| 6,830,993 B1 | 12/2004 | Im et al. |
| 6,858,477 B2 | 2/2005 | Deane et al. |
| 6,908,835 B2 | 6/2005 | Sposili et al. |
| 6,916,690 B2 | 7/2005 | Chang |

| | | |
|---|---|---|
| 6,961,117 B2 | 11/2005 | Im |
| 6,962,860 B2 | 11/2005 | Yamazaki et al. |
| 7,049,184 B2 | 5/2006 | Tanabe |
| 7,078,281 B2 | 7/2006 | Tanaka et al. |
| 7,091,411 B2 | 8/2006 | Falk et al. |
| 7,144,793 B2 | 12/2006 | Gosain et al. |
| 7,164,152 B2 | 1/2007 | Im |
| 7,187,016 B2 | 3/2007 | Arima |
| 7,217,605 B2 | 5/2007 | Kawasaki et al. |
| 7,259,081 B2 | 8/2007 | Im |
| 7,297,982 B2 | 11/2007 | Suzuki et al. |
| 7,300,858 B2 | 11/2007 | Im |
| 7,311,778 B2 | 12/2007 | Im et al. |
| 7,318,866 B2 | 1/2008 | Im |
| 7,319,056 B2 | 1/2008 | Im et al. |
| 7,326,876 B2 | 2/2008 | Jung |
| 7,341,928 B2 | 3/2008 | Im |
| 2001/0001745 A1 | 5/2001 | Im et al. |
| 2001/0041426 A1 | 11/2001 | Im |
| 2002/0083557 A1 | 7/2002 | Jung |
| 2002/0096680 A1 | 7/2002 | Sugano et al. |
| 2002/0104750 A1 | 8/2002 | Ito |
| 2002/0119609 A1 | 8/2002 | Hatano et al. |
| 2002/0151115 A1 | 10/2002 | Nakajima et al. |
| 2003/0000455 A1 | 1/2003 | Voutsas |
| 2003/0003242 A1 | 1/2003 | Voutsas |
| 2003/0006221 A1 | 1/2003 | Hong et al. |
| 2003/0013278 A1 | 1/2003 | Jang et al. |
| 2003/0014337 A1 | 1/2003 | Mathews et al. |
| 2003/0029212 A1 | 2/2003 | Im |
| 2003/0057418 A1 | 3/2003 | Asano |
| 2003/0068836 A1 | 4/2003 | Hongo et al. |
| 2003/0089907 A1 | 5/2003 | Yamaguchi et al. |
| 2003/0096489 A1 | 5/2003 | Im et al. |
| 2003/0119286 A1 | 6/2003 | Im et al. |
| 2003/0148565 A1 | 8/2003 | Yamanaka |
| 2003/0194613 A1 | 10/2003 | Voutsas et al. |
| 2003/0196589 A1 | 10/2003 | Mitani et al. |
| 2004/0041158 A1 | 3/2004 | Hongo et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0222187 A1 | 11/2004 | Lin |
| 2004/0224487 A1 | 11/2004 | Yang |
| 2005/0032249 A1 | 2/2005 | Im et al. |
| 2005/0034653 A1 | 2/2005 | Im et al. |
| 2005/0059224 A1 | 3/2005 | Im |
| 2005/0059265 A1 | 3/2005 | Im |
| 2005/0112906 A1 | 5/2005 | Maekawa et al. |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2005/0235903 A1 | 10/2005 | Im |
| 2005/0236908 A1 | 10/2005 | Rivin |
| 2006/0030164 A1 | 2/2006 | Im |
| 2006/0035478 A1 | 2/2006 | You |
| 2006/0102901 A1 | 5/2006 | Im et al. |
| 2006/0125741 A1 | 6/2006 | Tanaka et al. |
| 2006/0211183 A1 | 9/2006 | Duan et al. |
| 2006/0254500 A1 | 11/2006 | Im et al. |
| 2007/0007242 A1 | 1/2007 | Im |
| 2007/0010074 A1 | 1/2007 | Im |
| 2007/0020942 A1 | 1/2007 | Im |
| 2007/0032096 A1 | 2/2007 | Im |
| 2007/0108472 A1 | 5/2007 | Jeong et al. |
| 2007/0111349 A1 | 5/2007 | Im |
| 2007/0184638 A1 | 8/2007 | Kang et al. |
| 2007/0215877 A1 | 9/2007 | Chen et al. |
| 2008/0035863 A1 | 2/2008 | Im et al. |
| 2008/0176414 A1 | 7/2008 | Im |
| 2009/0001523 A1 | 1/2009 | Im |
| 2009/0045181 A1 | 2/2009 | Im |
| 2009/0137105 A1 | 5/2009 | Im |
| 2009/0173948 A1 | 7/2009 | Im et al. |
| 2009/0189164 A1 | 7/2009 | Im et al. |
| 2009/0218577 A1 | 9/2009 | Im |
| 2009/0242805 A1 | 10/2009 | Im |
| 2009/0309104 A1 | 12/2009 | Im |
| 2010/0032586 A1 | 2/2010 | Im et al. |
| 2010/0065853 A1 | 3/2010 | Im |
| 2010/0099273 A1 | 4/2010 | Im |

FOREIGN PATENT DOCUMENTS

| | | |
|---|---|---|
| DE | 10103670 | 8/2002 |
| EP | 681316 | 8/1995 |
| EP | 655774 | 7/1996 |
| EP | 1067593 | 10/2001 |
| GB | 2338342 | 12/1999 |
| GB | 2338343 | 12/1999 |
| GB | 2338597 | 12/1999 |
| JP | S57-027035 | 2/1982 |
| JP | S62-160781 | 7/1987 |
| JP | 62181419 | 8/1987 |
| JP | S62-216320 | 9/1987 |
| JP | H01-256114 | 10/1989 |
| JP | H02-081422 | 3/1990 |
| JP | 2283036 | 11/1990 |
| JP | 4279064 | 10/1992 |
| JP | H04-282869 | 10/1992 |
| JP | H05-048190 | 2/1993 |
| JP | 6252048 | 9/1994 |
| JP | 6283422 | 10/1994 |
| JP | 7176757 | 7/1995 |
| JP | H08-078330 | 3/1996 |
| JP | H09-007968 | 1/1997 |
| JP | H10-244390 | 9/1998 |
| JP | 11064883 | 3/1999 |
| JP | 11281997 | 10/1999 |
| JP | H11-297852 | 10/1999 |
| JP | 2000-223425 | 8/2000 |
| JP | 2000-346618 | 12/2000 |
| JP | 04033327 | 1/2001 |
| JP | 2001023920 | 1/2001 |
| JP | 2003-100653 | 4/2003 |
| JP | 2004-031809 | 1/2004 |
| KR | 2000-0053428 | 8/2000 |
| TW | 464960 | 11/2001 |
| WO | 9745827 | 12/1997 |
| WO | 9824118 | 6/1998 |
| WO | 9931719 | 6/1999 |
| WO | 0014784 | 3/2000 |
| WO | 0118854 | 3/2001 |
| WO | 0118855 | 3/2001 |
| WO | 0171786 | 9/2001 |
| WO | WO0171791 | 9/2001 |
| WO | 02031869 | 4/2002 |
| WO | 0242847 | 5/2002 |
| WO | 02086954 | 5/2002 |
| WO | 02086955 | 10/2002 |
| WO | 03018882 | 3/2003 |
| WO | 03046965 | 6/2003 |
| WO | 2004075263 | 8/2003 |
| WO | 03084688 | 10/2003 |
| WO | 2004017379 | 2/2004 |
| WO | 2004017380 | 2/2004 |
| WO | 2004017381 | 2/2004 |
| WO | 2004017382 | 2/2004 |
| WO | WO 2005029548 | 3/2005 |
| WO | WO 2005029550 | 3/2005 |
| WO | WO 2005029551 | 3/2005 |
| WO | WO20050029546 | 3/2005 |

OTHER PUBLICATIONS

Im et al., "Controlled Super-Lateral Growth of Si Films for Microstructural Manipulation and Optimization", Phys. Stat. Sol. (a), vol. 166, p. 603 (1998).

S.D. Brotherton et al., "Influence of Melt Depth in Laser Crystallized Poly-Si Thin Film Transistors," 82 J. Appl. Phys. 4086 (1997).

J.S. Im et al., "Crystalline Si Films for Integrated Active-Matrix Liquid-Crystals Displays," 21 MRS Bulletin 39 (1996).

Im et al., "Single-Crystal Si Films for Thin-Film Transistor Devices," Appl. Phys. Lett., vol. 70 (25), p. 3434 (1997).

Sposili et al., "Sequential Lateral Solidification of Thin Silicon Films on SiO2", Appl, Phys. Lett., vol. 69 (19), p. 2864 (1996).*

Crowder et al., "Low-Temperature Single-Crystal Si TFT's Fabricated on Si Films processed via Sequential Lateral Solidification", IEEE Electron Device Letter, vol. 19 (8), p. 306 (1998).*

Sposili et al., "Single-Crystal Si Films via a Low-Substrate-Temperature Excimer-Laser Crystallization Method", Mat. Res. Soc. Symp. Proc. vol. 452, pp. 953-958, 1997 Materials Reasearch Society.*

C. E. Nebel, "Laser Interference Structuring of A-SI:h" Amorphous Silicon Technology—1996, San Francisco, CA Apr. 8-12, 1996, Materials Research Society Symposium Proceedings, vol. 420, Pittsburgh, PA.

J. H. Jeon et al., "Two-step laser recrystallization of poly-Si for effective control of grain boundaries", Journal of Non Crystalline Solids, North-Holland Publishing Company, NL, vol. 266-269, May 2000, pp. 645-649.

H. Endert et al., "Excimer Laser: A New Tool for Precision Micromaching," 27 Optical and Quantum Electronics, 1319 (1995).

"Overview of Beam Delivery Systems for Excimer Lasers," Micro/Las Lasersystem GMBH, Jun. 1997.

K.H. Weiner et al., "Ultrashallow Junction Formation Using Projection Gas Immersion Laser Doping (PGILD)," A Verdant Technologies Technical Brief, Aug. 20, 1997.

Hau-Riege C.S. et al., "The Effects Microstructural Transitions at Width Transitions on interconnect reliabity," Journal of Applied Physics, Jun. 15, 2000, vol. 87, No. 12, pp. 8467-8472.

McWilliams et al., "Wafer-Scale Laser Pantography: Fabrication of N-Metal-Oxide-Semiconductor Transistors and Small-Scale Integrated Circuits By Direct-Write Laser-Induced Pyrolytic Reactions," Applied Physics Letters, American Institute of Physics, New York, US, vol. 43, No. 10, Nov. 1983, pp. 946-948.

Mariucci et al., "Grain boundary location control by patterned metal film in excimer laser crystallized polysilicon," Proceedings of the Figth International COnference on Polycrystalline Semiconductors, Schwabisch Gmund, Germany, Sep. 13-18, 1998, vol. 67-68, pp. 175-180.

Broadbent et al., "Excimer Laser Processing of A1-1%Cu/TiW Interconnect Layers," 1989 Proceedings, Sixth International IEEE VLSI Multilevel Interconnection COnference, Santa Clara, CA, Jun. 12-13, 1989, pp. 336-345.

H.J. Kim and James S. Im, "Grain Boundary Location-Controlled Poly-Si Films for TFT Devices Obtained Via Novel Excimer Laser Process," Abstracts for Symposium of Materials Research Society, Nov. 27 to Dec. 2, 1994, p. 230.

S.D. Brotherton, "Polycrystalline Silicon Thin Film Transistors," 10 Semicond. Sci. Tech., pp. 721-738 (1995).

H. Watanabe et al., "Crystallization Process of Polycrystalline Silicon by KrF Excimer Laser Annealing," 33 Japanese J. of Applied Physics Part 1—Regular Papers Short Notes & Review Papers, pp. 4491-4498 (1994).

E. Fogarassy et al., "Pulsed Laser Crystallization of Hydrogen-Free a-Si Thin Films for High-Mobility Poly-Si TFT Fabrication," 56 Applied Physics A—Solids and Surfaces, pp. 365-373 (1993).

Y. Miyata et al, "Low-Temperature Polycrystalline Silicon Thin-Film Transistors for Large-Area Liquid Crystal Display," 31 Japanese J. of Applied Physics Part 1—Regular Papers Short Notes & Review Papers, pp. 4559-4562 (1992).

Im et al., "Phase Transformation Mechanisms Involved in Excimer Laser Crystallization of Amorphous Silicon Films," Appl. Phys. Lett., vol. 63 (14), p. 1969 (1993).

Im et al., "On the Super Lateral Growth Phenomenon Observed in Excimer Laser-Induced Crystallization of Thin Si Films," Appl. Phys. Lett., vol. 64 (17), p. 2303 (1994).

Brochure from MicroLas Lasersystem, GmbH, "UV Optics Systems for Excimer Laser Based Micromaching and Marking". Jun. 1997.

Ishida et al., "Ultra-shallow boxlike profiles fabricated by pulsed ultraviolet-laser doping process", J. Vac. Sci. Technol. B 12(1), p. 399-403, 1994. (No month).

Yoshimoto, et al., "Excimer-Laser-Produced and Two-Dimensionally Position-Controlled Giant Si Grains on Organic SOG Underlayer", p. 285-286, AM-LCD 2000. No month.

Ozawa et al., "Two-Dimensionally Position-Controlled Exicer-Laser-Crystallization of Silicon Thin Films on Glassy Substrate", Jpn. J. Appl. Phys. vol. 38, Part 1, No. 10, p. 5700-5705, (1999). No month.

I.W. Boyd, Laser Processing of Thin Films and Microstructures, Oxidation, Deposition, and Etching of Insulators (Springer—Verlag Berlin Heidelber 1987).*

N. Yamamuchi and R. Reif, J., "Polycrystalline silicon thin films processed with silicon ion implantation and subsequent solid-phase crystallization: Theory, experiments, and thin-film transistor applications," Appl. Phys 75 (1994) 3235.

T. Noguchi, "Appearance of Single-Crystalline Properties in Fine-Patterned Si Thin Film Transistors (TFTs) by Solid Phase Crystallization (SPC)," Jpn. Appl. Phys. 32 (1993) L1584-L1587.

Ishihara et al., "A Novel Double-Pulse Exicem-Laser Crystallization Method of Silicon Thin-Films," Japanese Journal of Applied Physics, Publication Office Japanese Journal of Applied Physics, Tokyo, Japan, vol. 34, No. 8A, Aug. 1995, pp. 3976-3981.

Kim, H. J., "Excimer-Laser-Induced Crystallization of Amorophus Silicon Thin Films", Ph. D. Dissertation Abstract, Columbia University, 1996.*

Bergmann, R. et al., Nucleation and Growth of Crystalline Silicon Films on Glass for Solar Cells, Phys. Stat. Sol., 1998, pp. 587-602, vol. 166, Germany.

Biegelsen, D.K., L.E. Fennell and J.C. Zesch, Origin of oriented crystal growth of radiantly melted silicon on SiO/sub 2, Appl. Phys. Lett. 45, 546 (1984).

Boyd, Laser Processing of Thin Films and Microstructures, Oxidation, Deposition, and Etching of Insulators (Springer—Verlag Berlin Heidelber 1987).

Brotherton, S.D., et al., Characterisation of poly-Si TFTs in Directionally Solidified SLS Si, Asia Display/IDS'01, p. 387-390.

Crowder et al., "Parametric investigation of SLS-processed polysilicon thin films for TFT application," Preparations and Characterization, Elsevier, Sequoia, NL, vol. 427, No. 1-2, Mar. 3, 2003, pp. 101-107, XP004417451.

Crowder et al., "Sequential Lateral Solidification of PECVD and Sputter Deposited a-Si Films", Mat. Res. Soc. Symp. Proc. 621:Q.9.7.1-9.7.6, 2000.

Dassow, R. et al. Laser-Crystallized Polycrystalline Silicon on Glass for Photovoltaic Applications, Solid State Phenomena, pp. 193-198, vol. 67-68, Scitec Publications, Switzerland.

Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.

Dassow, R. et al., Laser crystallization of silicon for high-performance thin-film transistors, Semicond. Sci. Technol., 2000, pp. L31-L34, vol. 15, UK.

Dimitriadis, C.A., J. Stoemenos, P.A. Coxon, S. Friligkos, J. Antonopoulos and N.A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).

Geis et al., "Crystallographic orientation of silicon on an amorphous substrate using an artificial surface-relief grating and laser crystallization," Appl. Phys. Lett. 35(1) Jul. 1, 1979, 71-74.

Geis et al., "Silicon graphoepitaxy using a strip-heater oven," Appl. Phys. Lett. 37(5), Sep. 1, 1980, 454-456.

Geis et al., "Zone-Melting recrystallization of SI Films with a moveable-strip heater oven" J. Electro-Chem. Soc., 129: 2812 (1982).

Gupta et al., "Numerical Analysis of Excimer-laser induced melting and solidification of Si Thin Films", Applied Phys. Lett., 71:99, 1997.

Hau-Reige et al., "Microstructural Evolution Induced by Scanned Laser Annealing in A1 Interconnects," Appl. Phys. Lett., vol. 75, No. 10, p. 1464-1466, 1999.

Hawkins, W.G. et al., "Origin of lamellae in radiatively melted silicon films," appl. Phys. Lett. 42(4), Feb. 15, 1983.

Hayzelden, C. and J.L. Batstone, Silicide formation and silicide-mediated crystallization of nickel-implanted amorphous silicon thin films, J. Appl. Phys. 73, 8279 (1993).

Im, J.S., Method and system for producing crystalline thin films with a uniform crystalline orientation, U.S. Appl. No. 60/503,419; ref. file # 36013(BB); Columbia ref. M02-063.

Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.

Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.

Kahlert, H., "Creating Crystals", OE Magazine, Nov. 2001, 33-35.

Kim, C. et al., Development of SLS-Based SOG Display, IDMC 2005, Thu-15-02, 252-255.

Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.

Kim, H.J. et al., "New Excimer-laser-crystallization method for producing large-grained and grain boundary-location-controlled Si Films for Thin Film Transistors", Applied Phys. Lett., 68: 1513.

Kim, H.J. et al., "Multiple Pulse Irradiation Effects in Excimer Laser-Induced Crystallization of Amorphous Si Films," Mat. Res. Soc. Sym. Proc., 321:665-670 (1994).

Kim, H.-J., et al., "The effects of dopants on surface-energy-driven secondary grain growth in silicon films," J. Appl. Phys. 67 (2), Jan. 15, 1990.

Kimura, M. and K. Egami, Influence of as-deposited film structure on (100) texture in laser-recrystallized silicon on fused quartz, Appl. Phys. Lett. 44, 420 (1984).

Knowles, D.S. et al., "P-59: Thin Beam Crystallization Method: A New Laser Annealing Tool with Lower Cost and Higher Yield for LTPS Panels," SID 00 Digest, pp. 1-3, 2005.

Kohler, J.R. et al., Large-grained polycrystalline silicon on glass by copper vapor laser annealing. Thin Solid Films, 1999, pp. 129-132, vol. 337, Elsevier.

Kung, K.T.Y. and R. Reif, Implant-dose dependence of grain size and (110) texture enhancements in polycrystalline Si films by seed selection through ion channeling, J. Appl. Phys. 59, 2422 (1986).

Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).

Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).

Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657 (1994).

Lee, S.-W. and S.-K. Joo, Low temperature poly-Si thin-film transistor fabrication by metal-induced lateral crystallization, IEEE Electron Device Letters 17, 160 (1996).

Lee, S.-W., Y.-C. Jeon and S.-K. Joo, Pd induced lateral crystallization of amorphous Si thin films, Appl. Phys. Lett. 66, 1671 (1995).

Leonard, J.P. et al, "Stochastic modeling of solid nucleation in supercooled liquids", Appl. Phys. Lett. 78:22, May 28, 2001, 3454-3456.

Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.

Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.

Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on.

Mariucci et al., "Advanced excimer laser crystallization techniques," Thin Solid Films, vol. 338, pp. 39-44, 2001.

Micro/Las Lasersystem, GmbH, "UV Optics Systems for Excimer Laser Based Micromaching and Marking" (1999).

Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944 (2002).

Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).

Sato et al., "Mobility anisotropy of electrons in inversion layers on oxidized silicon surfaces" Physical Review B (State State) 4, 1950 (1971).

Smith, H.I. et al., "The Mechanism of Orientation in Si Graphoepitaxy by Laser or Strip Heater Recrystallization," J. Electrochem. Soc.: Solid-State Science and Technology, Taiwan FPD, Jun. 11, 2005, pp. 1-12.

Song et al., "Single Crystal Si Islands on SiO2 Obtained Via Excimer Laser Irradiation of a Patterned Si Film", Applied Phys. Lett., 68:3165, 1996.

Sposili et al., "Line-scan sequential lateral solidification of Si thin films", Appl. Phys. A67, 273-6, 1998.

Thompson, C.V. and H.I. Smith, Surface-energy-driven secondary grain growth in ultrathin (<100 nm) films of silicon, Appl. Phys. Lett. 44, 603 (1984).

van der Wilt, "The Commercialization of the SLS Technology," Taiwan FPD, Jun. 11, 2004, pp. 1-12.

Van Der Wilt, P.C., "State-of-the-Art Laser Crystallization of Si for Flat Panel Displays," PhAST, May 18, 2004, pp. 1-34.

Van Der Wilt, P.C., "Textured poly-Si films for hybrid SLS," Jul. 2004, pp. 1-5.

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Voutsas, A.T., A new era of crystallization: advances in polysilicon crystallization and crystal engineering, Applied Surface Science 250-262, 2003.

Voutsas, A.T., et al., Effect of process parameters on the structural characteristics of laterally grown, laser-annealed polycrystalline silicon films, Journal of Applied Physics, vol. 94, No. 12, p. 7445-7452, Dec. 15, 2003.

Weiner, K. H. et al. "Laser-assisted, Self-aligned Silicide Formation," A Verdant Technologies technical brief, Aug. 7, 1997, 1-9.

Werner, J.H., et al. From polycrystalline to single crystalline silicon on glass, Thin Solid Films 383, 95-100, 2001.

White et al., "Characterization of thin-oxide MNOS memory transistors" IEEE Trans. Electron Devices ED-19, 1280 (1972).

Gosain et al., "Formation of (100)-Textured Si Film Using an Excimer Laser on a Glass Substrate," Jpn. J. Appl. Phys., vol. 42 (2003) pp. L135-L137, Feb. 15, 2003.

Jeon et al., "New Excimer Laser Recrystallization of Poly-Si for Effective Grain Growth and Grain Boundary Arrangement," Jpn. J. Appl. Phys. vol. 39 (2000) pp. 2010-2014, Apr. 2000.

SYSTEM AND PROCESS FOR PROCESSING A PLURALITY OF SEMICONDUCTOR THIN FILMS WHICH ARE CRYSTALLIZED USING SEQUENTIAL LATERAL SOLIDIFICATION TECHNIQUES

CROSS-REFERENCE TO RELATED APPLICATIONS

This application is a continuation of U.S. patent application Ser. No. 10/544,498 filed Aug. 3, 2005 now U.S. Pat. No. 7,341,928 which is a national phase of International Application PCT/US04/004929, filed Feb. 18, 2004, which claims priority from U.S. Provisional Application Ser. No. 60/448,713, filed Feb. 19, 2003, each of which are incorporated by reference in their entireties herein, and from which priority is claimed.

FIELD OF THE INVENTION

The present invention relates to a system and process for processing a plurality of semiconductor thin films (such as silicon thin films) using a pulse energy beam. In particular, one exemplary embodiment of the system and process utilizes a pulsed beam in conjunction with a sequential lateral solidification ("SLS") technique to irradiate at least two semiconductor thin films, without stopping the emission of energy the pulsed beam. Another exemplary embodiment of the system and process also uses a pulsed beam to irradiate sections of the film such that the areas that have been irradiated and resolidified which have small-grains therein do not overlap one another, and can be used to place therein thin film transistor ("TFT") devices.

BACKGROUND INFORMATION

Semiconductor films, such as silicon films, are known to be used for providing pixels for liquid crystal display devices. Such films have previously been processed (i.e., irradiated by an excimer laser and then crystallized) via excimer laser annealing ("ELA") techniques. However, the semiconductor films processed using such known ELA methods often suffer from microstructural non-uniformities such as edge effects, which manifest themselves in availing a non-uniform performance of thin-film transistor ("TFT") devices fabricated on such films. In addition, it may take approximately 200 second to 600 seconds to completely process the semiconductor film sample using the ELA techniques, without even taking into consideration the time it takes to load and unload such sample.

Other more advantageous processes and systems for processing the semiconductor thin films for use in the liquid crystal displays and organic light emitting diode displays for fabricating large grained single crystal or polycrystalline silicon thin films using sequential lateral solidification ("SLS") techniques have been described. For example, U.S. Pat. Nos. 6,322,625 and 6,368,945 issued to Dr. James Im, and U.S. patent application Ser. Nos. 09/390,535 and 09/390,537, the entire disclosures of which are incorporated herein by reference, and which are assigned to the common assignee of the present application, describe such SLS systems and processes. These patent documents describe certain techniques in which one or more areas on the semiconductor thin film are, e.g., sequentially irradiated. One of the benefits of these SLS techniques is that the semiconductor film sample and/or sections thereof can be processed (e.g., crystallized) much faster that it would take for the processing the semiconductor film by the conventional ELA techniques. Typically, the processing/crystallization time of the semiconductor film sample depends on the type of the substrates, as well as other factors. For example, it is possible to completely process/crystallize the semiconductor film using the SLS techniques in approximately 50 to 100 seconds not considering the loading and unloading times of such samples.

In order to uniformly process the semiconductor films, it is important for the beam pulse to be stable. Thus, to achieve the optimal stability, it is preferable to pulse or fire the beam constantly, i.e., without stopping the pulsing of the beam. Such stability may be reduced or compromised when the pulsed beams are turned off or shut down, and then restarted. However, when the semiconductor sample is loaded and/or unloaded from a stage, the pulsed beam would be turned off, and then turned back on when the semiconductor sample to be processed was positioned at the designated location on the stage. The time for loading and unloading is generally referred to as a "transfer time." The transfer time for unloading the processed sample from the stage, and then loading another to-be-processed sample on the stage is generally the same when for the ELA techniques and the SLS techniques. Such transfer time can be between 50 and 100 seconds.

In addition, the costs associated with processing semiconductor samples are generally correlated with the number of pulses emitted by the beam source. In this manner, a "price per shot/pulse" is established. If the beam source is not shut down (i.e., still emit the beam pulses) when the next semiconductor sample is loaded unto the stage, or unloaded from the stage, the number of such irradiations by the beam source when the sample is not being irradiated by the beam pulse and corresponding time therefor is also taken into consideration for determining the price per shot. For example, when utilizing the SLS techniques, the time of the irradiation, solidification and crystallization of the semiconductor sample is relatively short as compared to the sample processing time using the ELA techniques. In such case, approximately half of the beam pulses are not directed at the sample since such samples are being either loaded into the stage or unloaded from the stage. Therefore, the beam pulses that are not impinging the samples are wasted.

Another exemplary technique for processing semiconductor thin film has been developed. In particular, such system and process can produce generally uniform areas on the substrate films such that the TFT devices can be situated in such areas. For example, portions of the irradiated film are irradiated, then nucleated (based on the threshold behavior of the beam pulse), and then solidified, such that upon re-solidification, the nucleated area becomes a region with uniform small grained material (to be referred to herein below as the "UGS techniques"). Thus, such UGS techniques are different from the SLS techniques in that for the SLS-techniques, the nucleated areas are avoided, while for the UGS techniques, the nucleated areas are utilized for placing the TFT devices therein. Indeed, using the UGS technique, there can be significant time savings since each irradiated area of the semiconductor thin film is irradiated once, without the need to re-irradiate a substantial portion thereof, while still providing a good uniform material therein. Many of these UGS techniques are described in U.S. Patent Application Ser. Nos. 60/405,084, 60/405,083 and 60/405,085, and International Applications PCT/US03/25946, PCT/US03/25972 and PCT/US03/25954, the entire disclosures of which are incorporated herein by reference.

Accordingly, it is preferable to reduce the price per shot, without stopping the emission of the beam pulses. It is also preferable to be able to process two or more semiconductor samples, without the need to stop or delay the emission of the pulsed beam by the beam source until the samples are loaded on the respective stages.

SUMMARY OF THE INVENTION

To achieve at least some of these objects, various systems and process according to the present invention are described below which can be utilized to, e.g., sequentially process a semiconductor (e.g., silicon) thin film sample (i.e., by irradiating and melting thin film of the sample, and allowing melted portions thereof to solidify and crystallize) on one stage, while unloading a previously-processed sample from another stage, and then loading an unprocessed sample thereon, without the need to shut down a pulsed beam. The exemplary embodiments of the systems and process for processing the samples in this manner shall be described in further detail below. However, it should be understood that the present invention is in no way limited to the exemplary embodiments of the systems and processes described herein.

One such exemplary embodiment of the process and system according to the present invention is provided for processing at least one section of each of a plurality of semiconductor film samples. With these process and system, the irradiation beam source can be controlled to emit successive irradiation beam pulses at a predetermined repetition rate. Using such emitted beam pulses, at least one section of one of the semiconductor film samples may be irradiated using at least one first sequential lateral solidification ("SLS") technique and/or at least one first uniform small grained material ("UGS") technique so as to process such section(s) of the first sample. Upon the completion of the processing of the section(s) of the first sample, the beam pulses can be redirected to impinge at least one section of a second sample of the semiconductor film samples. Then, using the redirected beam pulses, such section(s) of the second sample is irradiated using at least one second SLS technique and/or at least one second UGS technique to process the section(s) of the second sample. The first and second SLS and/or UGS techniques can be different from one another, or may be substantially the same.

According to another exemplary embodiment of the present invention, the second sample can be is an unprocessed sample. The first sample can be loaded on a stage of a first chamber, and the second sample may be loaded on a stage of the second chamber. In addition, during the irradiation of the first sample, a third sample of the film samples that was previously irradiated and processed using the first SLS/UGS technique(s) and/or the second SLS/UGS technique(s) can be unloaded from the stage of the second chamber. Then, the second sample may be loaded unto the stage of the second chamber.

In yet another exemplary embodiment of the present invention, during the irradiation of the second sample, the first sample can be unloaded from the stage of the first chamber. Thereafter and during the irradiation of the second sample, a fourth unprocessed sample of the film samples may be loaded unto the stage of the first chamber. Upon the completion of the loading of the fourth sample, the beam pulse may again be redirected to impinge the section(s) of the fourth sample. After such redirection, such section(s) of the fourth sample can be irradiated using the first SLS/UGS technique(s) and/or the second SLS/UGS technique(s) so as to process the section(s) of the fourth sample.

According to still another exemplary embodiment of the present invention, the beam pulses can be redirected using a beam redirecting arrangement which may include a beam reflection device. Further, if is determined that the second sample has not been successfully loaded unto the stage of the second chamber, the irradiation of the second sample can be prevented or delayed until the second sample is successfully loaded unto the stage of the second chamber. If it is determined that the entire section(s) of the first sample was/were not successfully processed, the irradiation of the second sample can be prevented or delayed until the processing of all of the section(s) of the first sample has/have been successfully processed.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION

Certain systems and processes for providing continuous motion SLS are described in U.S. Pat. Nos. 6,322,625 and 6,368,945 and U.S. patent application Ser. Nos. 09/390,535 and 09/390,537. In addition, systems and processes for providing uniform small grained materials ("UGS") techniques are described in U.S. Patent Application Ser. Nos. 60/405,084, 60/405,083 and 60/405,085, and International Applications PCT/US03/25946, PCT/US03/25972 and PCT/US03/25954. Exemplary systems and processed according to the present invention can employ principles and components thereof to sequentially process a thin film of each of two or more semiconductor samples In particular, the system and process according to the present invention can be used to process two or more samples (provided on distinct stages). Each of the sample has an amorphous silicon thin film provided thereon.

Figure 1:
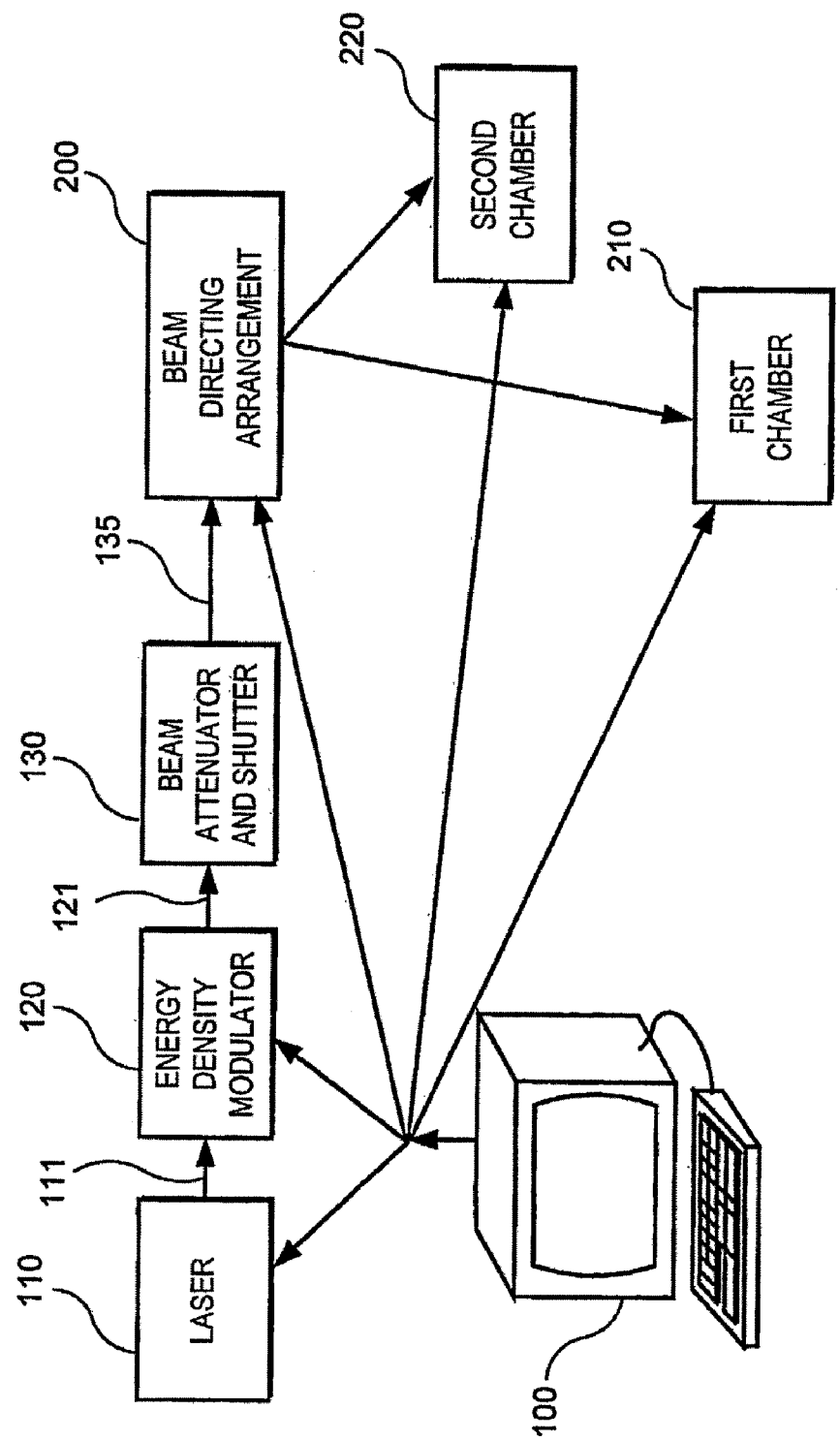
FIG. 1 is a schematic block diagram of an exemplary embodiment of a sequential-lateral solidification ("SLS") and/or uniform small grained material ("UGS") processing system according to the present invention which processes semiconductor samples, sequentially, in two or more chambers using a beam directing arrangement.

In particular, as shown in FIG. 1, an exemplary embodiment of the system according to the present invention may include a beam source 110 (e.g., a Lambda Physik model LPX-315I XeCl pulsed excimer laser) emitting a pulsed irradiation beam (e.g., a laser beam), a controllable beam energy density modulator 120 for modifying the energy density of the irradiation beam, and a MicroLas two plate variable attenuator 130 (e.g., from MicroLas). It should be understood by those skilled in the art that instead of the beam source 110 (e.g., the pulsed excimer laser), it is possible to use a pulsed solid state laser, a chopped continuous wave laser, a pulsed electron beam and a pulsed ion beam, etc. Typically, the radiation beam pulses 111 generated by the beam source 110 provide a beam intensity in the range of 10 mJ/cm$^2$ to 1 J/cm$^2$, a pulse duration (FWH) in the range of 10 to 300 nsec, and a pulse repetition rate in the range of 10 Hz to 300 Hz. The modulated beam pulses 135 exiting a beam attenuator and shutter 130 can be provided to a beam directing arrangement 200, which further directs the pulsed beam either to a first chamber 210 or to a second chamber 220. Exemplary details of such chambers 210, 220 shall be described below in further detail, with reference to FIG. 2.

Each of the first and second chambers 210, 220 is configured to be able to load therein the semiconductor sample prior to the thin film (or portion thereof) of such sample being irradiated and melted by the pulsed beam, solidified and then crystallized using one or more sequential lateral solidification ("SLS") and/or uniform small grained materials ("UGS") techniques. In addition, upon the completion of such processing of the semiconductor sample, each of these chambers 210, 220 can be configured to remove the SLS/UGS-processed sample therefrom, and load another unprocessed sample after the previously SLS-processed sample is removed.

The exemplary embodiment of the system illustrated in FIG. 1 also includes a processing arrangement 100 (e.g., a computer which includes a microprocessor executing instructions thereon, such as those implemented by software stored on its storage device or which is provided remotely therefrom). This processing arrangement 100 is communicably coupled to the beam source 110, the energy density modulator 120, and the beam attenuator and shutter 130. In this manner, the processing arrangement 100 can control the rate of the pulse of the beam being emitted by the beam source 110. The processing arrangement 100 can also control the repetition of the pulsed beam, as well as its modulation and attenuation (e.g., using arrangements 120, 130).

The processing arrangement 100 is further communicably coupled to the beam directing arrangement 200, the first chamber 210 and the second chamber 220. Such coupling by the processing arrangement 100 to first chamber 210 and the second chamber 220 provides information to the processing arrangement regarding whether the entire sample in the respective chamber has been completely crystallized using the particular SLS and/or UGS technique, if the previously processed sample has been unloaded from the chamber, and if the unprocessed sample has been loaded into such chamber. In addition, the processing arrangement 100 can control the loading and unloading of the sample into the chambers 210, 220.

With such information, the processing arrangement 100 can control the beam directing arrangement 200 to selectively direct the pulsed beam 135 toward the first chamber 210 or the second chamber, depending on the information obtained by the processing arrangements 100 from these chambers 210, 220. The details of the control by the processing arrangement 100 of the beam directing arrangement 200 based on such information shall be described in further detail below.

In exemplary operation of the system and process according to the present invention, the SLS and/or UGS processing of the sample in the first chamber 210 can be performed under the control of the processing arrangement 100 such that the pulsed beam 135 is provided by the beam directing arrangement 200 to the first chamber 210 so as to irradiate and crystallize the semiconductor sample therein. During such SLS-processing of the sample in the first chamber 210, the previously SLS-processed sample situated in the second chamber 220 is unloaded also under the control and direction of the processing arrangement 100, and a different, previously-unprocessed sample is loaded into this second chamber 220.

Upon the completion of the SLS and/or UGS processing of the sample in the first chamber 210, the processing arrangement 100 determines if the new unprocessed sample has been properly loaded into the second chamber 220 (e.g., unto a stage thereof). If that is the case, the processing arrangement 100 controls the beam directing arrangement 200 to direct the pulsed beam 135 toward the second chamber 220 so as to SLS-process and/or UGS-process the new sample that has been loaded into the second chamber 220. When the SLS-processing of this sample in the second chamber 220 is commenced, the processing arrangement 100 controls the first chamber 210 (e.g., a stage thereof) to unload the SLS/UGS-processed sample therefrom, and then load another yet-unprocessed semiconductor sample into the first chamber 210. In this manner, while one sample is being processed in one chamber, another unprocessed sample is loaded to a further chamber to be SLS/UGS-processed immediately or shortly thereafter.

As described above, this exemplary procedure is effectuated, without shutting down the beam source 110, by re-directing the beam from the previously irradiated chamber to another chamber which has loaded therein the unprocessed sample so as to subsequently SLS/UGS-process such sample. This exemplary procedure continues until it is determined (either by the processing arrangement 100 and/or manually by an operator of the system) that the intended samples have been SLS/UGS-processed. At that time, the beam source 110 is shut down, and the loading/unloading of the samples in the first and second chambers 210, 220 can be stopped.

In this manner, the pulsed beam 135 is operated until all intended samples have been SLS-processed, without being shut down between the processing of the subsequent samples. Therefore, due to the fact the pulsed beam is not shut down by the beam source 110, such beam can be pulsed or shot continuously, and its stability would not be compromised. In addition, the loading and unloading time within of one chamber can be used to process a further semiconductor sample in another chamber so as to continuously process the samples in the chambers, and thus the price-per-shot achieved with these system and process of the present invention may be significantly smaller that the price-per-shot effectuated by the conventional systems.

Figure 2:
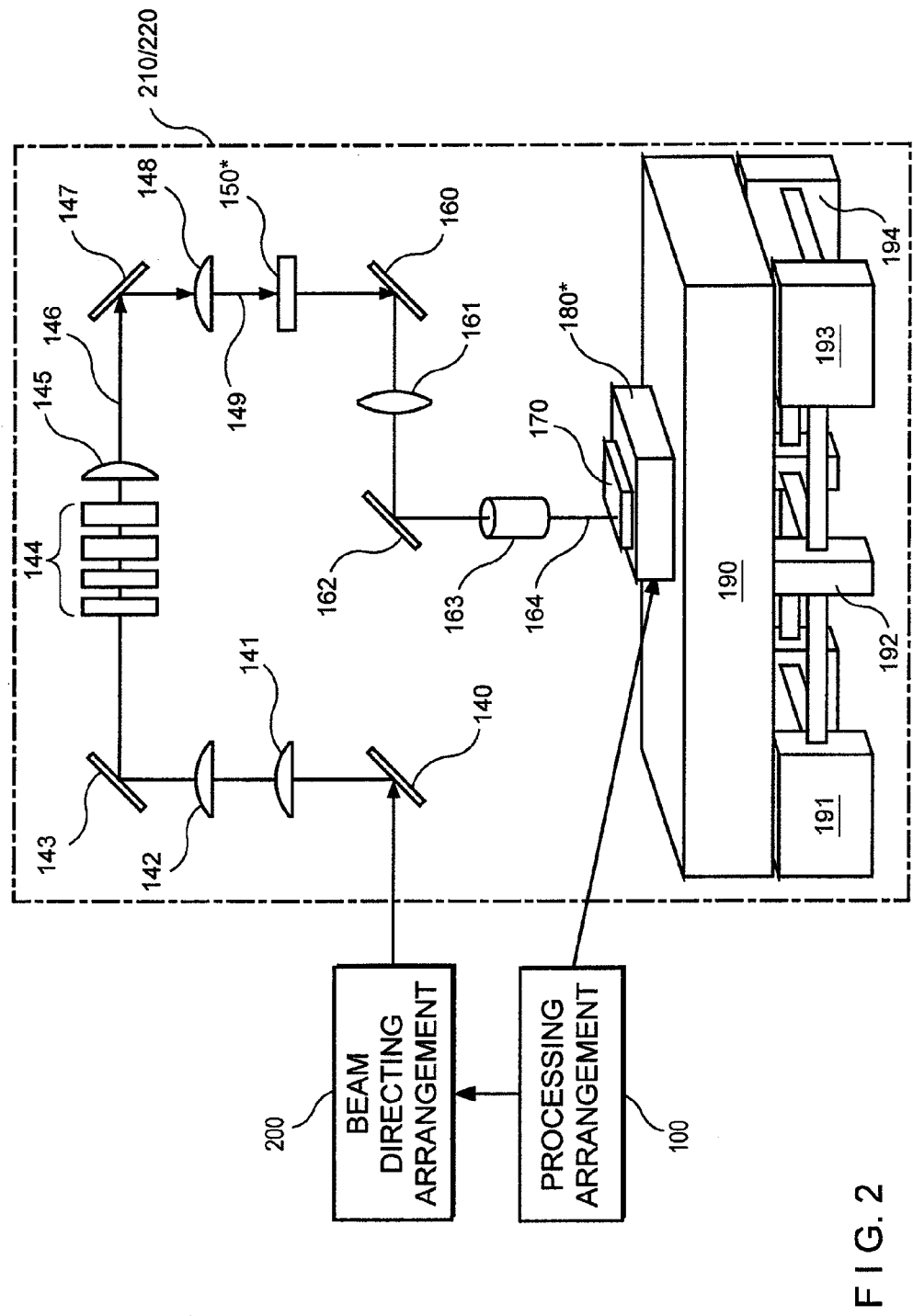
FIG. 2 is a detailed illustration of an exemplary embodiment of one or more chambers shown in FIG. 1.

FIG. 2 shows a detailed illustration of an exemplary embodiment of at least one of the chambers 210, 220 that are provided in FIG. 1. In particular, the exemplary chamber of FIG. 2 includes beam steering mirrors 140, 143, 147, 160 and 162, beam expanding and collimating lenses 141 and 142, a beam homogenizer 144, a condenser lens 145, a field lens 148, a projection mask 150 which may be mounted in a translating stage (not shown), a 4×-6× eye piece 161, a controllable shutter 152, a multi-element 4×-6× objective lens 163 for focusing a radiation beam pulse 164 onto the sample 170 having the semiconductor thin film to be processed mounted on a sample translation stage 180, and a granite block optical bench 190 supported on a vibration isolation and self-leveling system 191, 192, 193 and 194. The pulsed beam 135 is forwarded toward the chamber and to the beam steering mirror 140 by the beam directing arrangement 200

The computing arrangement 100 is communicably coupled to and the sample translation stage 180. As described in U.S. Pat. Nos. 6,322,625 and 6,368,945, the sample translation stage 180 is preferably controlled by the processing arrangement 100 to effectuate translations of the sample 170 in the planar X-Y directions, as well as in the Z direction. In this manner, the processing arrangement 100 can control the relative position of the sample 170 with respect to the irradiation beam pulse 164 directed at the respective sample 170. In addition, the processing arrangement 100 can control the loading of the sample 170 to the translation stage 180, and unloading thereof from the translation stage 180, in the manner described herein above, and as shall further be described below.

Figure 3:
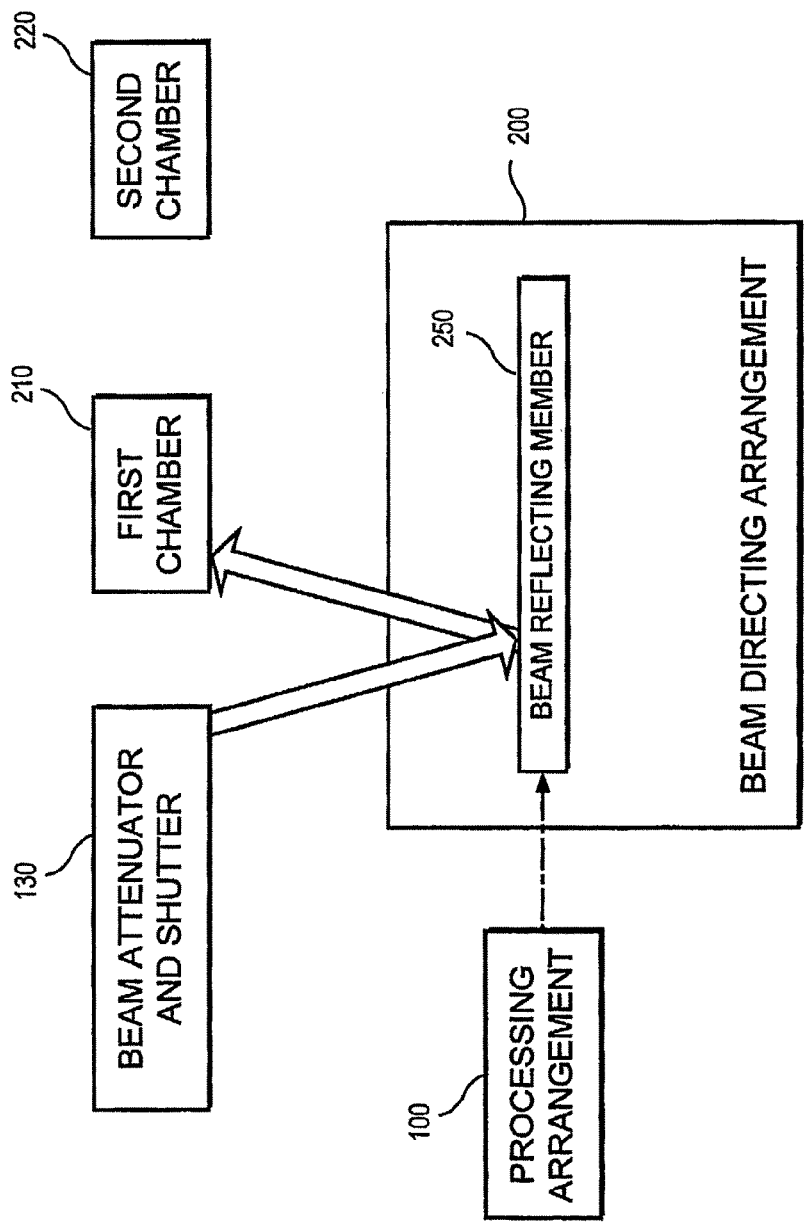
FIG. 3 is a detailed illustration of an exemplary embodiment of the beam directing arrangement of FIG. 1.

FIG. 3 shows a detailed illustration of an exemplary embodiment of the beam directing arrangement 200 of FIG. 1. In particular, the beam directing arrangement 200 is designed so as to selectively direct the pulsed beam 135 toward a particular chamber, e.g., pursuant to the instructions of the processing arrangement 100. As described above, upon the completion of the SLS-processing of the sample 170 in the first chamber 210, the processing arrangement 100 may configure the beam directing arrangement 200 to direct the pulsed beam to the second chamber 220 so as to SLS-process the newly-loaded and previously unirradiated sample 170 that is provided on the translation stage 180 of the second chamber 220.

This can be accomplished by providing a beam reflecting member 250 (e.g., a mirror) in the beam directing arrangement 200 so that it would be able to selective control the path of the pulsed beam 135 (based on the instructions of the processing arrangement 100) toward the first chamber 210 or the second chamber 220. It should be understood by those skilled in the art that, either in addition or instead of the beam reflecting member 250, it is also possible to use other mechanical components in the beam directing arrangement 200 to selectively direct the pulsed beam in the manner discussed above.

Figure 4:
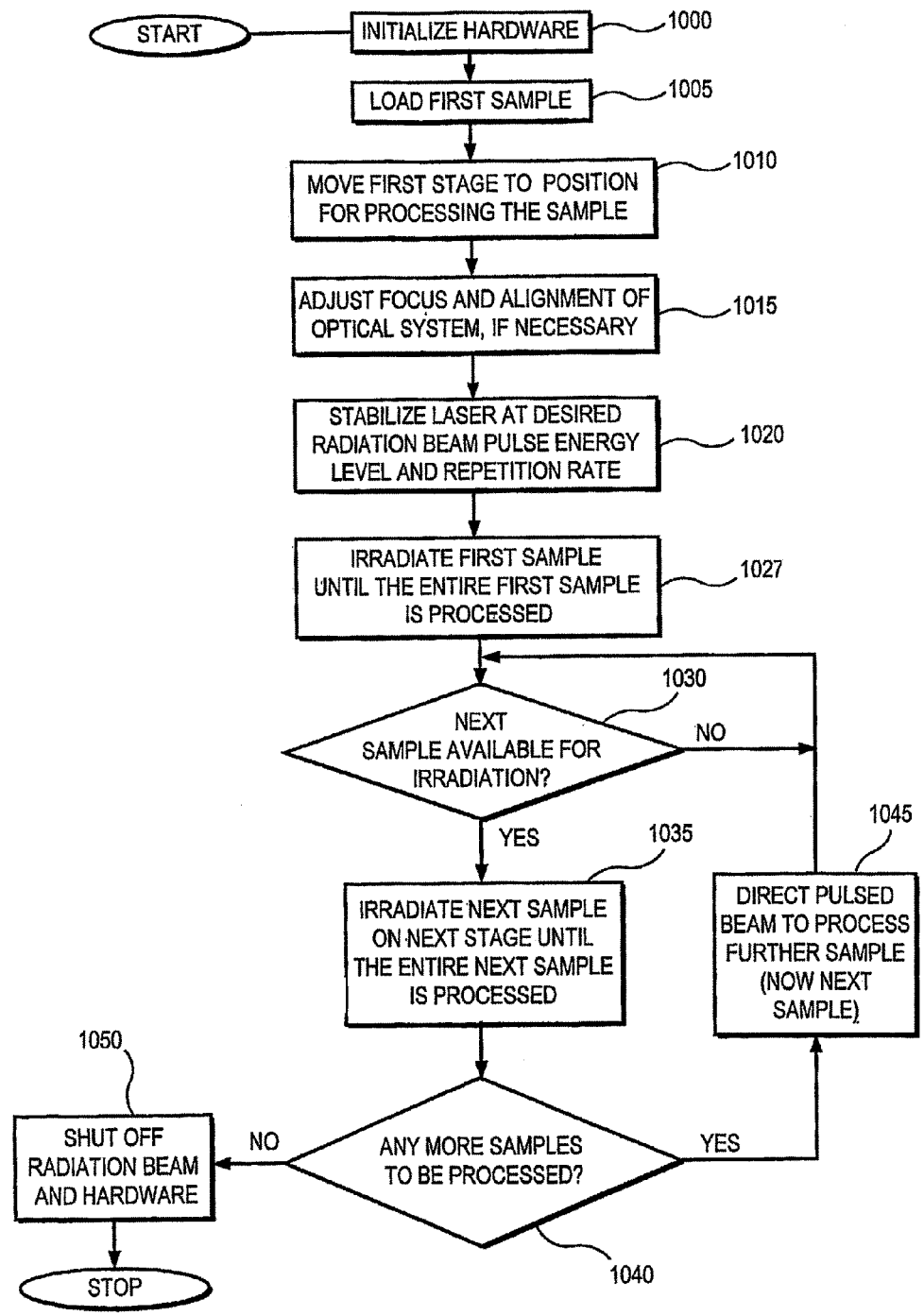
FIG. 4 is a top-level flow diagram of an exemplary embodiment of a process according to the present invention for sequentially SLS-processing or UGS-processing two or more samples, each being provided in its respective chamber.

FIG. 4 shows a top-level flow diagram of an exemplary embodiment of a process according to the present invention for sequentially SLS-processing and/or UGS-processing two or more samples, with each sample being provided in the respective chamber. In step 1000, the hardware components of the system of FIG. 1, such as the beam source 110, the energy beam modulator 120, and the beam attenuator and shutter 130 are first initialized at least in part by the processing arrangement 100. The sample 170 is loaded onto the sample translation stage 180 of the first chamber in step 1005. It should be noted that such loading may be performed either manually or automatically using known sample loading apparatuses under the control of the processing arrangement 100. Next, the sample translation stage 180 of the first chamber 210 can be moved, preferably under the control of the computing arrangement 100, to an initial position in step 1010. Various other optical components of one or more of the chambers 210, 220 may be adjusted and/or aligned either manually or under the control of the processing arrangement 100 for a proper focus and alignment in step 1015, if necessary. In step 1020, the irradiation beam 111 can be stabilized at a predetermined pulse energy level, pulse duration and repetition rate.

Then, in step 1027, the entire sample 170 that is provided on the stage 180 of the first chamber 210 is irradiated according to one or more of the SLS-techniques and/or UGS-techniques described in the publications listed above until such sample is completely processed. Then, in step 1030, the processing arrangement 100 determines if the next unprocessed sample is available in the second chamber 220. In particular, it is determined if the next unprocessed sample 170 has been loaded into the translation stage 180 of the second chamber 220. If that is not the case, then the exemplary process according to the present invention waits until the sample 170 is loaded unto the stage 180 of the second chamber 220. Otherwise, in step 1035, the unprocessed sample 170 arranged on the translation stage 180 of the second chamber 220 is irradiated according to one or more of the SLS/UGS-techniques until it is completely processed.

Then, in step 1040, it is determined whether there are any further samples to be SLS-processed and/or UGS-processed. If so, in step 1045, the pulsed beam is directed to process another unprocessed sample that is loaded unto the translation stage 180 of the first chamber 210 (from which the previously SLS/UGS-processed sample has been unloaded), and the process according to the present invention returns to step 1030 for processing such unprocessed sample 170 that is provided in the first chamber 210, as described above. If, in step 1040, it is determined that there are no more samples to be processed, and the hardware components and the beam 111 of the system shown in FIG. 1 can be shut off in step 1050, and this process may be terminated.

Figure 5:
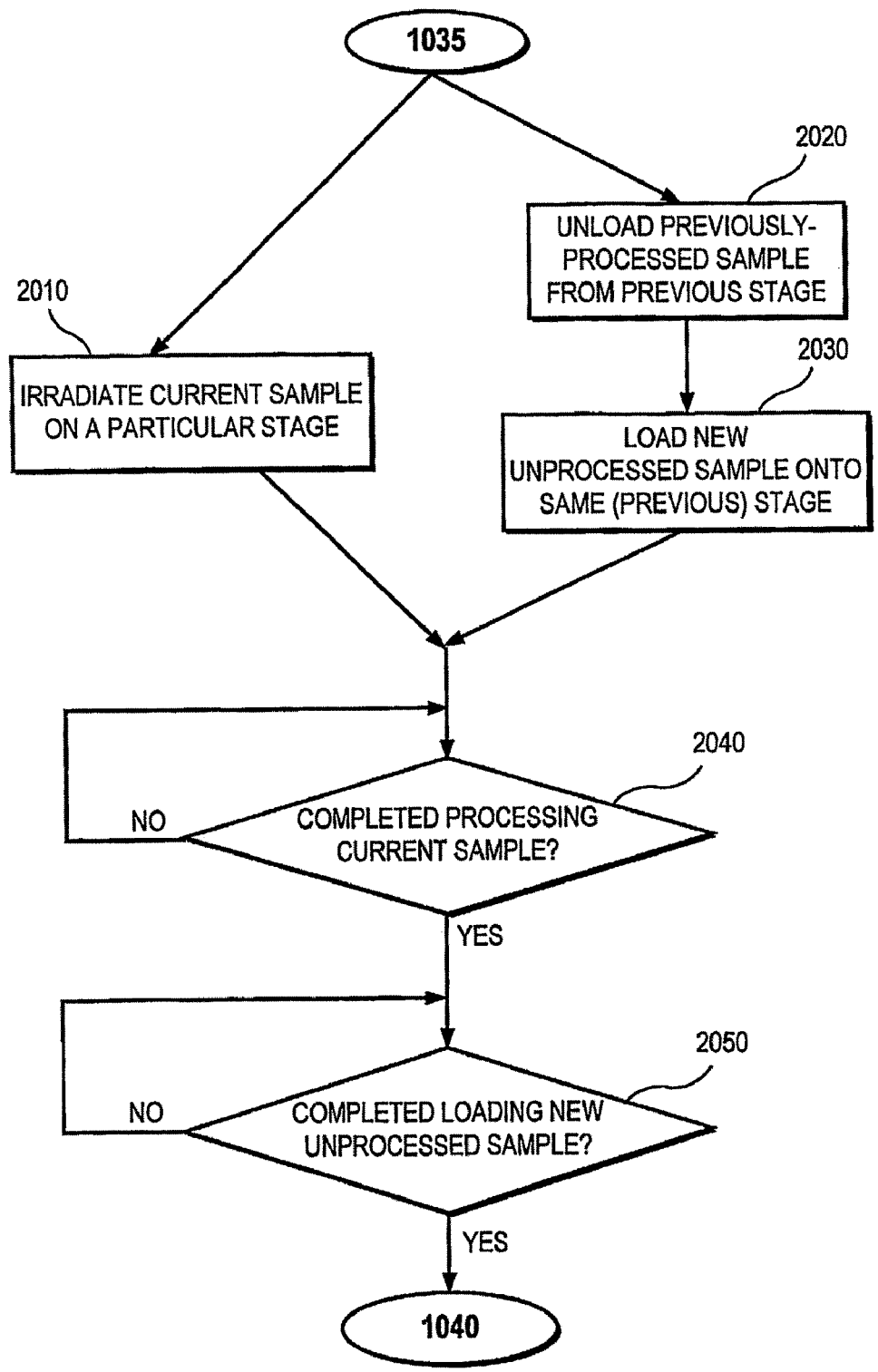
FIG. 5 is a detailed flow diagram of an exemplary embodiment of the process according to the present invention in which one sample on one stage is being processed, while previously SLS-processed or UGS-processed sample is removed from another stage and an unprocessed sample is loaded thereon.

FIG. 5 shows a detailed flow diagram of an exemplary embodiment of step 1035 of the process according to the present invention in which the sample 170 provided on one translation stage 170 of a particular chamber (e.g., the second chamber 220) is being SLS/UGS-processed, while previously SLS-processed sample 170 is unloaded from the translation stage 180 of another chamber (e.g., the first chamber 210), and an unprocessed sample is loaded thereon. In particular, while the sample 170 (provided in the second chamber 220) is being irradiated to be completely SLS/UGS-processed in step 2010, the previously SLS/UGS-processed sample 170 of the first chamber 210 is unloaded from this chamber 210 (step 2020), and then another unprocessed sample 170 is loaded unto the translation stage 180 of the first chamber 210 (step 2030). Step 2010 is preferably performed contemporaneously (or at least in the same time period) as steps 2020 and 2030.

Thereafter, it is determined, in step 2040, whether the SLS/UGS-processing of the sample 170 provided in the second chamber 220 being irradiated in step 2010 has been completed. If not, the process according to the present invention (preferably under the control of the processing arrangement 100) waits until the processing of such sample 170 is completed in the second chamber 220. Otherwise, it is determined, in step 2050, whether the new unprocessed sample 170 is loaded onto the translation stage 180 of the first chamber 210. If such unprocessed sample 170 has not yet been loaded, the pulsed beam is provided away from the completely SLS/UGS-processed sample 170 that is arranged in the second chamber 220 with the aid of the beam directing arrangement 200, and under the control of the processing arrangement 100. This is performed without the need to shut down the beam source 110, thus not compromising the stability of the pulsed beam 135, 164. If it is determined that the unprocessed sample 170 has been loaded onto the translation stage 180 of the first chamber 210, the process according to the present invention continues to step 1040, directs the pulsed beam (using the beam directing arrangement 200 under the control of the processing arrangement 100) to irradiate and completely SLS-process the unprocessed sample 170 loaded onto the stage 180 of the first chamber 210.

It is to be understood that while the invention has been described in conjunction with the detailed description hereof, the foregoing description is intended to illustrate and not limit the scope of the invention. Other aspects, advantages, and modifications are within the scope of the present invention. In particular, other exemplary embodiments of the system and process according to the present invention can process the samples provided in more than two chambers. For such embodiments, the processing arrangement 100 may control the beam directing arrangement to selectively direct the pulsed beam 135 to each of these chambers when new unprocessed samples are loaded therein.

The foregoing merely illustrates the principles of the invention. Various modifications and alterations to the described embodiments will be apparent to those skilled in the art in view of the teachings herein. For example, while the above embodiment has been described with respect to at least partial lateral solidification and crystallization of the semiconductor thin film, it may apply to other materials processing techniques, such as micro-machining, photo-ablation, and micro-patterning techniques, including those described in International patent application no. PCT/US01/12799 and U.S. patent application Ser. Nos. 09/390,535, 09/390,537 and 09/526,585, the entire disclosures of which are incorporated herein by reference. The various mask patterns and intensity beam patterns described in the above-referenced patent application can also be utilized with the process and system of the present invention. It will thus be appreciated that those skilled in the art will be able to devise numerous systems and methods which, although not explicitly shown or described herein, embody the principles of the invention and are thus within the spirit and scope of the present invention.

What is claimed is:

1. A method for processing thin film samples, comprising:
   (a) controlling an irradiation beam source to emit beam pulses;
   (b) using the beam pulses, processing at least one section of a first sample of the thin film samples to obtain at least one of a predetermined grain structure and a predetermined grain pattern therein;
   (c) redirecting the beam pulses; and
   (d) using the redirected beam pulses, processing at least one section of a second sample to obtain at least one of a predetermined grain structure and a predetermined grain pattern therein.

2. The process according to claim 1, wherein the first sample is provided on a first stage in a first chamber, and the second sample is provided on a second stage in a second chamber.

3. The process according to claim 2, wherein the second sample is loaded on the second stage after a third sample is unloaded from the second stage, where the unloading of the third sample and loading of the second sample is completed while the first sample is being irradiated by the beam pulses.

4. The process according to claim 3, wherein the first sample is unloaded from the first stage, thereafter a fourth sample is loaded on the same stage, where the unloading of the first sample and loading of the fourth sample is completed while the second sample is being irradiated by the beam pulses.

5. A system for processing thin film samples, comprising:
   (a) a beam source generating irradiation beam pulses;
   (b) processing means optically coupled to the beam source and receiving the generated beam pulses therefrom, for processing at least one section of a first sample of the film samples using at least one of a SLS and a UGS technique; and
   (c) beam redirecting means optically coupled to the beam source and coupled to the processing means for redirecting at least one of the beam pulses for processing at least one section of a second sample of the thin film samples.

6. The system according to claim 5, wherein the system further comprises at least a first chamber and a second chamber wherein a first sample is provided on a stage in the first chamber and a second sample is provided on a stage in the second chamber, wherein the first sample chamber and the second sample chamber are coupled to the redirecting means and configured to receive the beam pulses at different times.

7. The system according to claim 6, wherein the system is operable to (a) process at least one section of the sample in the first chamber using at least one of a first SLS and a first UGS technique;
   (b) redirect the beam pulses; and
   (c) process at least one section of the sample in the second chamber using at least one of a second SLS and a second UGS technique.

8. The system according to claim 7, wherein the system is operable to effect an unloading of a third sample from the second stage then a loading of the second sample onto the second stage, while the first sample is being processed.

* * * * *